United States Patent
Preti et al.

(10) Patent No.: US 12,522,948 B2
(45) Date of Patent: *Jan. 13, 2026

(54) TREATING ARRANGEMENT WITH LOADING/UNLOADING GROUP AND EPITAXIAL REACTOR

(71) Applicant: LPE S.p.A., Baranzate (IT)

(72) Inventors: Silvio Preti, Baranzate (IT); Francesco Corea, Baranzate (IT)

(73) Assignee: LPE S.p.A., Baranzate (IT)

( * ) Notice: Subject to any disclaimer, the term of this patent is extended or adjusted under 35 U.S.C. 154(b) by 836 days.

This patent is subject to a terminal disclaimer.

(21) Appl. No.: 17/763,915

(22) PCT Filed: Oct. 2, 2020

(86) PCT No.: PCT/IB2020/059235
§ 371 (c)(1),
(2) Date: Mar. 25, 2022

(87) PCT Pub. No.: WO2021/064651
PCT Pub. Date: Apr. 8, 2021

(65) Prior Publication Data
US 2022/0341058 A1    Oct. 27, 2022

(30) Foreign Application Priority Data

Oct. 3, 2019 (IT) .......................... 102019000017792
Nov. 19, 2019 (IT) .......................... 102019000021501

(51) Int. Cl.
*C30B 35/00* (2006.01)
*B08B 5/04* (2006.01)
(Continued)

(52) U.S. Cl.
CPC .............. *C30B 35/005* (2013.01); *B08B 5/04* (2013.01); *C23C 16/4583* (2013.01);
(Continued)

(58) Field of Classification Search
CPC ........... B08B 5/04; C30B 25/02; C30B 25/10; C30B 25/20; C30B 35/00; C30B 35/005;
(Continued)

(56) References Cited

U.S. PATENT DOCUMENTS 5,088,444 A * 2/1992 Ohmine ............ H01L 21/67748
118/725
6,245,152 B1 * 6/2001 Imai ........................ C30B 25/02
118/500
(Continued)

FOREIGN PATENT DOCUMENTS

CN        106498366 A      3/2017
JP        2000077389 A      3/2000
(Continued)

*Primary Examiner* — Benjamin Kendall
(74) *Attorney, Agent, or Firm* — Dickinson Wright PLLC; Andrew D. Dorisio; Nicholas P. Coleman (57) ABSTRACT

The treating arrangement (900) for an epitaxial reactor (1000) comprises: a reaction chamber (100) for treating substrates, a transfer chamber (200) adjacent to the reaction chamber (100), for transferring substrates placed over substrates support devices, a loading/unloading group (300) at least in part adjacent to the transfer chamber (200), arranged to contain a substrates support device with one or more substrates, a storage chamber (400) containing at least in part the loading/unloading group (300), having a first storage zone (410) for treated and/or untreated substrates and a second storage zone (420) for substrates support devices without any substrate, at least one external robot (500) for transferring treated substrates, untreated substrates and substrates support devices without any substrate between said storage chamber (400) and said loading/unloading group (300), at least one internal robot (600) for transferring substrates support devices with one or more substrates between said loading/unloading group (300) and said reaction chamber (100) via said transfer chamber (200); said (Continued)

loading/unloading group comprises a load-lock chamber (300A) and a preparation station (300B) associated with each other.

20 Claims, 5 Drawing Sheets (51) Int. Cl.
    *C23C 16/458*     (2006.01)
    *C30B 25/02*     (2006.01)
    *C30B 25/10*     (2006.01)
    *H01L 21/687*     (2006.01)
(52) U.S. Cl.
    CPC ............. *C30B 25/02* (2013.01); *C30B 25/10* (2013.01); *H01L 21/68707* (2013.01)
(58) Field of Classification Search
    CPC ...... C23C 14/564–568; C23C 16/4583; H01L 21/67167; H01L 21/67207; H01L 21/6773; H01L 21/67742; H01L 21/67748; H01L 21/67766; H01L 21/68; H01L 21/6838; H01L 21/68707; H01L 21/68742; H01J 37/32899
    See application file for complete search history.

(56) References Cited

U.S. PATENT DOCUMENTS

| | | | |
|---|---|---|---|
| 2005/0205209 A1* | 9/2005 | Mosden | H01L 21/67069 |
| | | | 156/345.31 |
| 2008/0203636 A1* | 8/2008 | Schenck | H01L 21/68728 |
| | | | 269/25 |
| 2009/0084403 A1* | 4/2009 | Shindo | H01L 21/67207 |
| | | | 15/103.5 |
| 2009/0263230 A1* | 10/2009 | Hwang | H01L 21/6875 |
| | | | 414/222.09 |
| 2010/0055330 A1* | 3/2010 | Huang | H01L 21/67778 |
| | | | 118/69 |
| 2011/0163065 A1 | 7/2011 | Verhaverbeke et al. | |
| 2011/0232569 A1* | 9/2011 | Olgado | H01L 21/67742 |
| | | | 414/222.01 |
| 2012/0247671 A1* | 10/2012 | Sugawara | H01J 37/32642 |
| | | | 156/345.31 |
| 2013/0221595 A1 | 8/2013 | Verhaverbeke et al. | |
| 2014/0176701 A1* | 6/2014 | Okuno | H01L 21/67742 |
| | | | 348/125 |
| 2015/0059978 A1 | 3/2015 | Park et al. | |
| 2015/0364352 A1* | 12/2015 | Deshpande | H01L 21/68707 |
| | | | 414/298 |
| 2017/0040204 A1 | 2/2017 | Kim et al. | |

FOREIGN PATENT DOCUMENTS

| | | |
|---|---|---|
| JP | 2010219317 A | 9/2010 |
| JP | 2014027028 A | 2/2014 |
| JP | 2016512398 A | 4/2016 |
| JP | 2018532264 A | 11/2018 |
| WO | 2004053187 A1 | 6/2004 |
| WO | 2004053188 A1 | 6/2004 |
| WO | 2007088420 A2 | 8/2007 |
| WO | 2015092525 A1 | 6/2015 |
| WO | 2018078944 A1 | 9/2019 |

\* cited by examiner

TREATING ARRANGEMENT WITH LOADING/UNLOADING GROUP AND EPITAXIAL REACTOR

FIELD OF THE INVENTION

The present invention relates to a new concept epitaxial reactor (see for example the attached FIG. 1), in particular a reactor for the epitaxial deposition of silicon carbide on silicon carbide substrates for electrical, in particular electronic, applications.

STATE OF THE ART

Reactors for epitaxial deposition have been known for decades.

Reactors for epitaxial deposition of silicon carbide have also been known for a long time and, in the past, the Applicant itself filed patent applications in this regard.

SUMMARY

Figure 1:
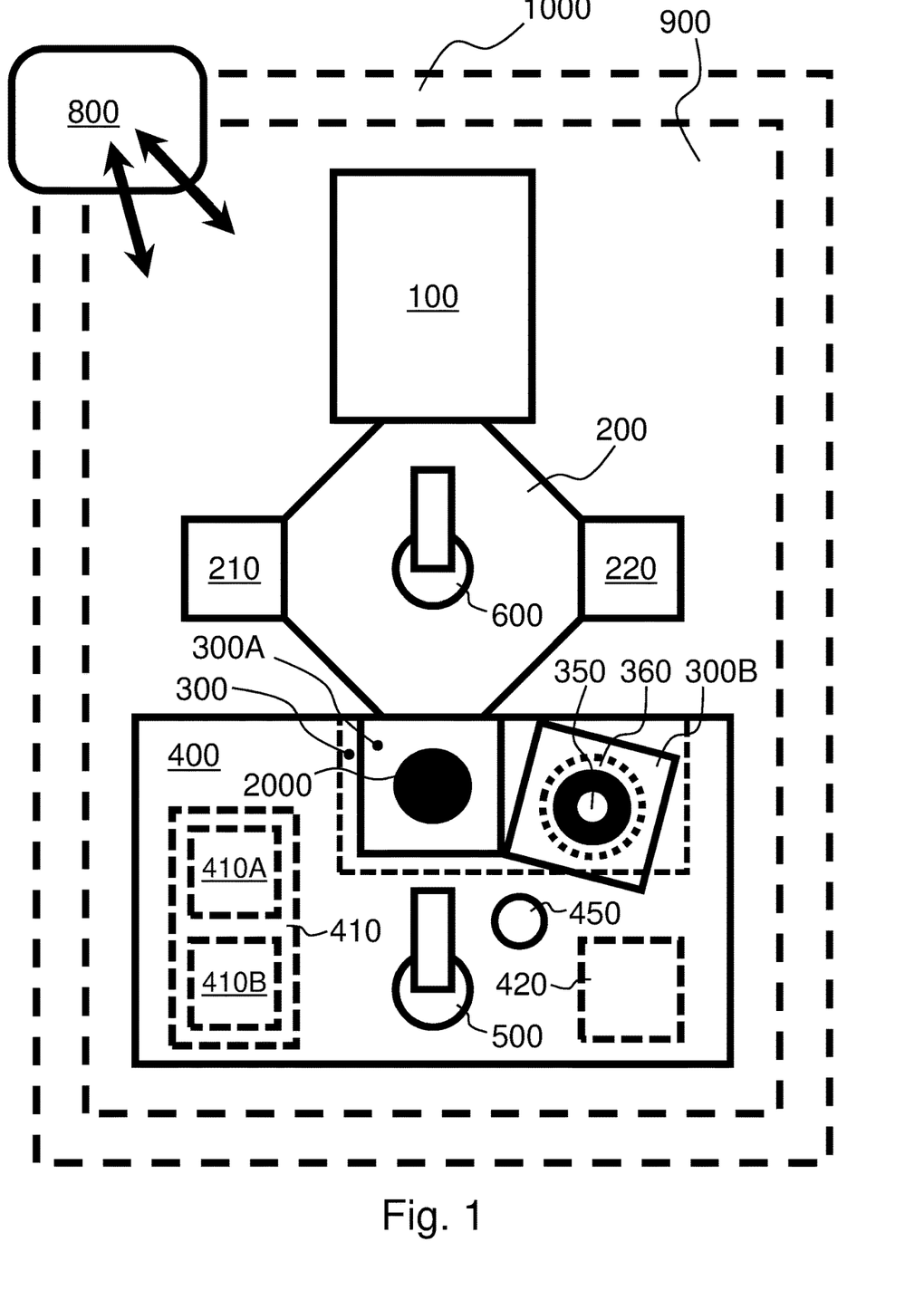
FIG. 1 shows a schematic view (which can be considered a top view) of an embodiment example of an epitaxial reactor according to the present invention, in which the treating arrangement is particularly detailed.

The main innovations of the present epitaxial reactor concern: the storage chamber (for example 400 in FIG. 1), the loading/unloading group (for example 300 in FIG. 1), and the transfer chamber (for example 200 in FIG. 1). These three elements (chamber), together with the reaction chamber (for example 100 in FIG. 1), can be considered parts of a so-called "treating arrangement" (for example 900 in FIG. 1) of the epitaxial reactor (for example 1000 in FIG. 1).

Figure 2A:
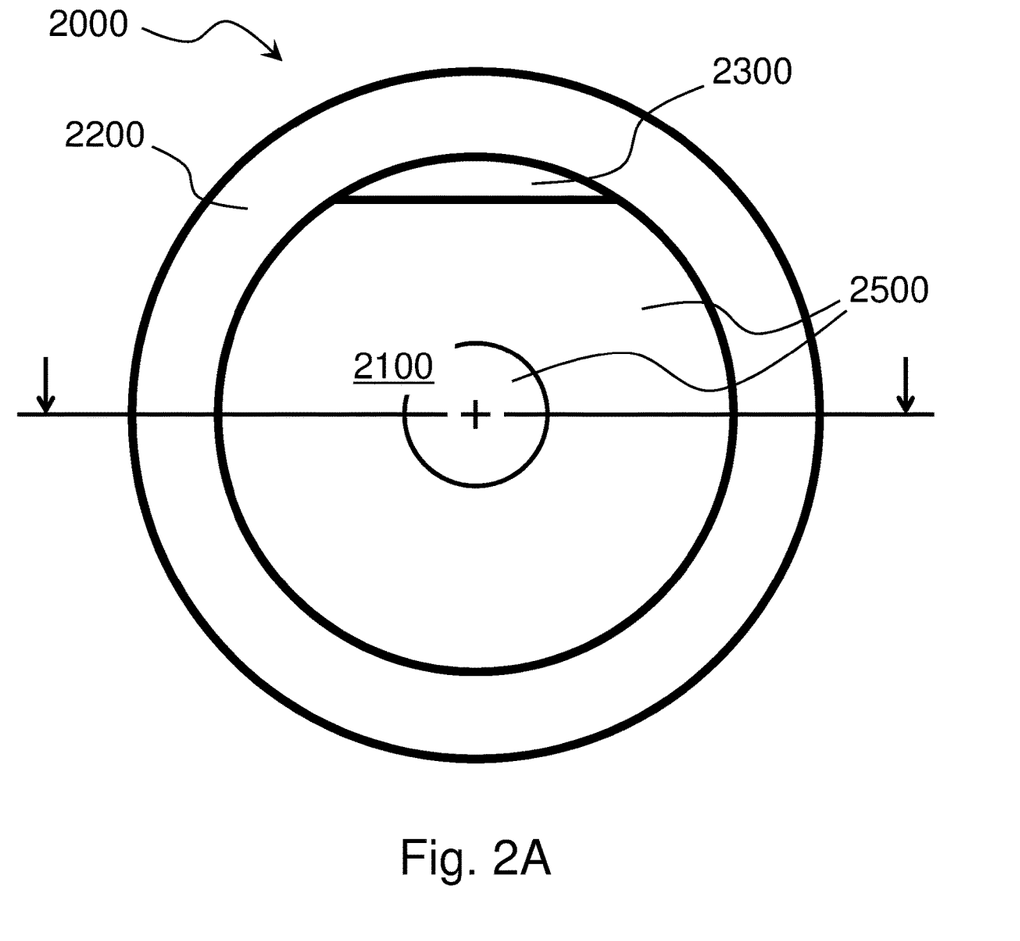
FIG. 2A shows a top (schematic) view of an embodiment example of a "substrates support device" according to the present invention.
Figure 2B:
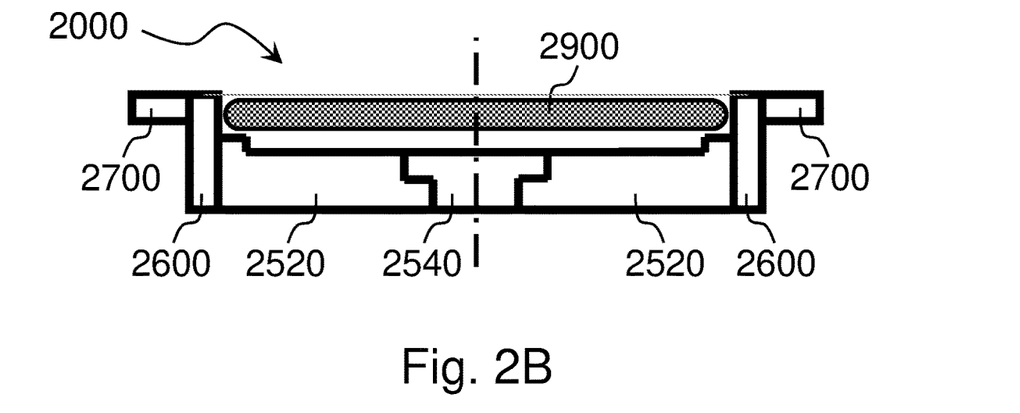
FIG. 2B shows a sectional (schematic) view of the "substrates support device" of FIG. 2A.

In the reactor according to the present invention, the substrates are placed over a "substrates support device" before a treating process and are removed from the "substrates support device" after the treating process; these two operations are carried out automatically inside the storage chamber. The "substrates support device" can be arranged to support and transport one or more substrates at the same time, possibly inserted in special recesses called "pockets", and is therefore a sort of "tray" which is inserted into the reaction chamber and extracted from the reaction chamber. In particular, a particularly advantageous "substrates support device" for the reactor according to the present invention has a discoidal shape and is shown schematically and by way of example in the attached FIG. 2 (FIG. 2A is a top view and FIG. 2B is a sectional view) which will be described below.

The general object of the present invention is to improve the prior art.

This object is achieved thanks to the treating arrangement having the technical characteristics expressed in the appended claims.

An aspect of the present invention is also an epitaxial reactor; said epitaxial reactor comprises the treating arrangement object of the appended claims.

In particular, it concerns a reactor for epitaxial deposition at high temperature (in particular higher than 1,300° C. and lower than 1,800° C.) of layers of semiconductor material on substrates of semiconductor material for the production of electrical components; instead, the process pressure is typically comprised between 0.03 atm (=3,000 Pa) and 0.5 atm (50,000 Pa).

More particularly, it concerns a reactor for epitaxial deposition arranged to extract from the reaction chamber (treated) substrates at high temperature (in particular higher than 400° C. and more particularly higher than 800° C.).

Even more particularly, it concerns a reactor for epitaxial deposition arranged to introduce (untreated) substrates into the reaction chamber at high temperature (in particular higher than 400° C. and more particularly higher than 800° C.).

Advantageously, the substrates to be treated and the treated substrates are located on "substrates support devices".

LIST OF FIGURES

The present invention shall become more readily apparent from the detailed description that follows to be considered together with the accompanying drawings in which.

As can be easily understood, there are various ways of practically implementing the present invention which is defined in its main advantageous aspects in the appended claims and is not limited either to the following detailed description or to the appended claims.

DETAILED DESCRIPTION

With reference to FIG. 1, an embodiment example of an epitaxial reactor 1000 according to the present invention comprising a so-called "treating arrangement" 900.

The most typical and advantageous application of the present invention is in reactors for epitaxial deposition of layers of semiconductor material (in particular silicon carbide) on substrates of semiconductor material (in particular silicon carbide) for the production of electrical components. These are reactors in whose reaction chamber epitaxial deposition processes are carried out at high temperature (in particular higher than 1,300° C. and lower than 1,800° C.) and at a pressure typically comprised between 0.03 atm (=3,000 Pa) and 0.5 atm (50,000 Pa); specific tests were carried out by the Applicant, for example at 1,600° C. and 0.1 atm (10,000 Pa).

In FIG. 1, an electronic control unit 800 is shown which, depending on the functions, can be considered part of the epitaxial reactor 1000, i.e. of the entire system, or of the treating arrangement 900, i.e. a sub-system thereof. In general, it is possible for an epitaxial reactor to comprise several electronic control units each dedicated to the control of one or more sub-systems. In the example of FIG. 1, the electronic control unit 800 is arranged to control at least the treating arrangement 900 and, for this purpose, receives and sends electrical signals from and to components of the treating arrangement 900 (this is schematically represented by the two large black arrows).

In general, an epitaxial reactor, including the epitaxial reactor according to the present invention, comprises a control console which can also be considered part of a control unit of the epitaxial reactor.

The treating arrangement 900 consists of four basic components:
- a reaction chamber 100 for treating substrates,
- a transfer chamber 200 adjacent to the reaction chamber 100,
- a loading/unloading group 300 at least in part adjacent to the transfer chamber 200, and
- a storage chamber 400 containing at least in part the loading/unloading group 300.

It should be noted that, alternatively, the chambers 200 and 300 could be integrated and constitute a single chamber.

According to typical and advantageous embodiments of the present invention, the reaction chamber is of the type with "hot walls" heated by induction. In particular, this is arranged to be at "high temperature" even when epitaxial deposition processes are not in progress; said "high temperature" is lower than the "process temperature", but higher than the "ambient temperature"; for example, it can be equal to 30-70% of the "process temperature" expressed in degrees Celsius. According to typical and advantageous embodiments of the present invention, the reaction chamber can have technical characteristics similar to those shown and described in the international patent applications WO2004053187, WO2004053188, WO2007088420 and WO2015092525 (which are incorporated herein by reference).

According to typical and advantageous embodiments of the present invention, the reaction chamber comprises a susceptor arrangement consisting of four susceptor elements ("walls") which define a reaction and deposition zone; furthermore, there is another susceptor element ("disk" or "cylinder") which is arranged to remain inside the reaction and deposition zone and to rotate around its axis at least during the epitaxial deposition processes. This other susceptor element is arranged to provide a rest for the "substrates support device" which, on the other hand, is arranged to be introduced into the reaction and deposition zone (with one or more untreated substrates) before an epitaxial deposition process and extracted from the reaction and deposition zone after an epitaxial deposition process (with one or more treated substrates), advantageously when the "substrates support device" (and the substrates) is still hot, in particular at a temperature higher than 500° C. or even higher (e.g. 900° C. or 1,000° C.).

In the example of FIG. 1, advantageously, the loading/unloading group 300 consists of a load-lock chamber 300A and of a preparation station 300B associated with each other (as will be better understood below), in particular these two elements are distinct but close (for example, between 0 cm and 10 cm); alternatively (see FIG. 6), they could be integrated with each other.

In the example of FIG. 1, the load-lock chamber 300A is located totally inside the chamber 400 and adjacent to the chamber 200.

In the example of FIG. 1, the preparation station 300B is totally located inside the chamber 400.

In general, an epitaxial reactor comprises so-called "gate valves" arranged to selectively separate the reactor chambers. In the case of the reactor of FIG. 1, a first "gate valve" between the chamber 100 and the chamber 200 and a second "gate valve" between the chamber 200 and the chamber 300A and a third "gate valve" between the chamber 300A and the chamber 400 are provided (but not shown in the figure); furthermore, a door, preferably hermetic, is provided (but not shown in the figure) to allow operators to access the inside of the chamber 400 and put/remove substrates and substrates support devices.

As already mentioned, in the reactor according to the present invention, the use of "substrates support devices" is envisaged.

The "substrates support device" 2000 of FIG. 2, particularly advantageous for the reactor according to the present invention, has a recess (indicated with 2100 in FIG. 2A), so-called "pocket", almost circular in shape to house a substrate (not shown in FIG. 2A and indicated with 2900 in FIG. 2B) substantially of the same shape and size as the recess, and a thin edge (indicated with 2200 in FIG. 2A) which protrudes radially along its entire perimeter to facilitate the handling of the "substrates support device". The substrate has a so-called "flat"; in the recess (indicated with 2100 in FIG. 2A) there is a plug (indicated with 2300 in FIG. 2A) at the "flat" of the substrate.

The "substrates support device" 2000 of FIG. 2 can also be described by means of a set of parts as follows (see in particular FIG. 2B). It comprises a plate-like part, simply called "plate", 2500 of circular shape which has a rest surface arranged to support a substrate 2900; in particular, the rest surface has substantially the same shape and size as the substrate and constitutes the bottom of the recess 2100; the plug (indicated with 2300 in FIG. 2A) is conceptually superimposed on the plate 2500. The device 2000 further comprises a first edge part 2600 which entirely surrounds the plate 2500 and which extends axially so as to constitute the side wall of the recess 2100 (a small part of this wall is constituted by the plug 2300). The device 2000 finally comprises a second edge part 2700 which entirely surrounds the first edge part 2600 and extends radially; it can be said that the second edge part 2700 is a flange located around the first edge part 2600. Typically, the plate 2500 is at a lower level than the second edge portion 2700. The edge 2200 of FIG. 2A substantially corresponds to the second edge part 2700 of FIG. 2B. It should be noted that the parts described above can be joined to form one or more single pieces; for example, the parts 2500, 2600 and 2700 can form a single piece or the part 2500 can form a first single piece and the parts 2600 and 2700 can form a second single piece. Furthermore, it should be noted that each of the parts described above can be formed by two or more single pieces mechanically coupled together; an example relating to the plate 2500 is described below.

Particularly and advantageously, the plate 2500 is divided into an annular portion or part 2520 and a central portion or part 2540 coupled together; the annular portion or part 2520 is integral with the first edge part 2600 and the central portion or part 2540 is inserted in a hole of the annular portion or part 2520 and can be raised and lowered with respect to the annular portion or part 2520 acting from the outside of the "substrates support device" 2000 (in particular from below in FIG. 2B) for example by means of a movable rod; in the absence of such external action, the central portion or part 2540 remains in position by means of a suitable mechanical coupling between the portions or parts 2520 and 2540. If a substrate 2900 is inserted in the recess 2100, by raising/lowering the central portion or part 2540, the substrate 2900 raises/lowers, too.

Particularly and advantageously, the rest surface of the plate 2500 is configured in such a way that the substrate 2900 is in contact only with a small annular zone of the plate 2500 near the first edge part 2600. For example, said small annular zone can have a width of 1-5 mm and/or can be radially distanced from the first edge part 2600 by 1-3 mm. The distance between the substrate 2900 and a central zone of the plate 2500 can be, for example, 0.5-1.5 mm.

Generally according to the present invention, the treating arrangement comprises:
- a reaction chamber (100 in the example of FIG. 1) for treating substrates,
- a transfer chamber (200 in the example of FIG. 1) adjacent to the reaction chamber (100 in the example of FIG. 1), for transferring substrates placed over substrates support devices,
- a loading/unloading group (300 in the example of FIG. 1) at least in part adjacent to the transfer chamber (200 in the example of FIG. 1), arranged to contain a substrates support device with one or more substrates,
- a storage chamber (400 in the example of FIG. 1) containing at least in part the loading/unloading group (300 in the example of FIG. 1), having a first storage zone (410 in the example of FIG. 1) for treated and/or untreated substrates and a second storage zone (420 in the example of FIG. 1) for substrates support devices without any substrate,
- at least one, in particular only one, external robot (500 in the example of FIG. 1
- in this figure the robot is shown with a symbol) for transferring treated substrates, untreated substrates and substrates support devices without any substrate between the storage chamber (400 in the example of FIG. 1) and the loading/unloading group (300 in the example of FIG. 1)—in particular situations, for example anomalous operation of the reactor, the external robot can also transfer substrates support devices with substrates,
- at least one, in particular only one, internal robot (600 in the example of FIG. 1
- in this figure the robot is shown with a symbol) for transferring substrates support devices with one or more substrates between the loading/unloading group (300 in the example of FIG. 1) and said reaction chamber (100 in the example of FIG. 1) via the transfer chamber (200 in the example of FIG. 1).

The external robot 500 is located at least in part inside the storage chamber 400 and the internal robot 600 is located at least in part inside the transfer chamber 200.

In the example of FIG. 1, the external robot 500 is also arranged to carry out any transfers internal to the loading/unloading group 300, in particular to transfer substrates support devices with one or more substrates still to be treated from the preparation station 300B to the load-lock chamber "300A, and substrates support devices with one or more substrates already treated from the "load-lock" chamber 300A to the preparation station 300B.

The (chamber) elements mentioned above, in particular the loading/unloading group, can also have an active role in handling substrates and/or "substrates support devices", i.e. be equipped with means arranged to move them.

In the reactor according to the present invention, the substrates are placed over a "substrates support device" before a treating process and are removed from the "substrates support device" after the treating process; these two operations are carried out automatically by the external robot 500 inside the storage chamber (400 in the example of FIG. 1). A support device with untreated substrates is transferred from the loading/unloading group (300 in the example of FIG. 1), in particular from its load-lock chamber, to the reaction chamber (100 in the example of FIG. 1) before a treating process and the same support device yet with treated substrates is transferred from the reaction chamber (100 in the example of FIG. 1) to the loading/unloading group (300 in the example of FIG. 1), in particular to its load-lock chamber, after the treating process; these two transfer operations are carried out automatically by the internal robot 600.

It should be noted that, typically, the same "substrates support device" can be used for several treating processes; in the example described below, the same device is used for two processes. At the beginning and before a first treating process, the robot 500 takes a "substrates support device" from the zone 420 and puts it in the station 300B, then it takes (at least) an untreated substrate from the zone 410 (for example from the sub-zone 410A) and puts it over the "substrates support device" which is located in the station 300B; after the first treating process, the robot 500 takes (at least) the treated substrate from the "substrates support device" which is located in the station 300B and puts it in the zone 410 (for example in the sub-zone 410B); afterwards and before a second treating process, the robot 500 takes (at least) another untreated substrate from the zone 410 (for example from the sub-zone 410A) and puts it over the "substrates support device" which is located in the station 300B; after the second treating process, the robot 500 takes (at least) the other treated substrate from the "substrates support device" which is located in the station 300B and puts it in the zone 410 (for example in the sub-zone 410B); finally, the robot 500 takes the "substrates support device" from the station 300B and puts it elsewhere, for example in the zone 420. As previously mentioned, typically, the external robot 500 is also arranged to transfer substrates support devices with one or more substrates still to be treated from the preparation station 300B to the load-lock chamber 300A, and substrates support devices with one or more substrates already treated from the load-lock chamber 300A to the preparation station 300B.

Conceptually, the external robot and the internal robot are similar in that they are capable of performing similar movements. Typically, both comprise an articulated arm consisting of three arm members and a so-called "end-effector". It should be noted that the third arm member and the "end-effector" of the internal robot are particular as they are arranged to approach and enter the reaction chamber which is typically located at a very high temperature (800-1,600° C.); it can be equipped with position sensors (for example of the "feeler" type) to help position the "end-effector".

Innovations regarding the storage chamber will be described below (for example the one indicated with 400 in FIG. 1) with non-limiting reference to the attached figures; this is why the technical characteristics of the embodiment examples shown in the figures are referred to only as "possible".

The external robot 500 may comprise an articulated arm 510 arranged to handle both treated substrates and untreated substrates as well as substrates support devices.

The first storage zone 410 can be located on a first side of the storage chamber 400 and the second storage zone 420 can be located on a second side of the storage chamber 400; in FIG. 1, the second side is opposite to the first side considering the position of the external robot 500.

The first storage zone 410 can be divided into a first sub-zone 410A only for untreated substrates and a second sub-zone 410B only for treated substrates.

The storage chamber 400 can have a third storage zone (not shown in FIG. 1) for support devices with substrates; this storage zone could be suitable for use in the event of anomalous situations, for example such as to require the intervention of an operator; alternatively, the third storage zone could be used for test and/or calibration substrates. It should be noted that, according to some embodiment examples, support devices with substrates could be stored in the second storage zone 420 in case of anomalous situations.

Advantageously, the electronic control unit of the epitaxial reactor provides for the possibility of programming the positioning of the untreated substrates and/or of the treated substrates and/or of the substrates support devices in the storage chamber; in particular, the positioning of each of them can be set not only horizontally but also vertically; advantageously, the positioning of a substrate before treatment can be different from the positioning of the same substrate after treatment. In this way, there is maximum flexibility of positioning.

Typically, according to the present invention, a plurality of substrates can be placed one above the other, at a certain distance from each other, in a zone or sub-zone of the storage chamber inside a suitable box. In general, a box can house both untreated and treated substrates.

Typically, according to the present invention, a plurality of substrates support devices can be placed one above the other, at a certain distance from each other, in a zone or sub-zone of the storage chamber inside a suitable box.

According to a first possibility (not shown in the figures), the articulated arm comprises a first arm member and a second arm member, the first arm member is hinged to the second arm member, the first arm member has a first end portion arranged to handle (in particular grasp) treated and untreated substrates, a second end portion arranged to handle (in particular grasp) substrates support devices, and an intermediate portion hinged to the second arm member.

In the present description, the term "to grasp" is used to indicate a relatively firm contact between a first part, called "grasping", and a second part, called "grasped", while the term "to handle" only indicates that the two parts are such as to move together.

According to a second possibility (shown by way of example in FIG. 3), the articulated arm 510 comprises a first arm member 512 and a second arm member 516, the first arm member 512 is hinged to the second arm member 516, the first arm member 512 has a first end portion 513 arranged to handle both treated substrates and untreated substrates as well as substrates support devices, and a second end portion 514 hinged to the second arm member 516.

Figure 3:
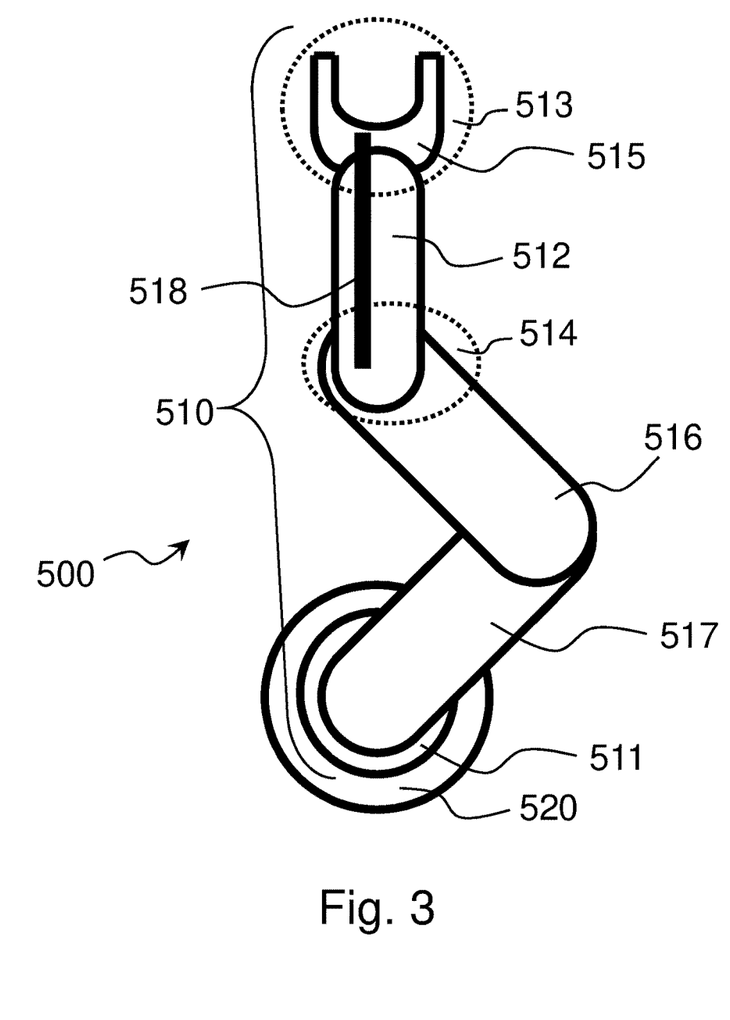
FIG. 3 shows (schematically) an external robot for a storage chamber of an embodiment example of an epitaxial reactor according to the present invention.

The articulated arm 510 can also comprise a base 520.

The articulated arm 510 may also comprise a lifting column 511 mounted on the base 520.

The articulated arm 510 can also comprise a third arm member 517 hinged at a first end to the second arm member 516 and at a second end to the lifting column 511.

The first arm member 512 can comprise or be associated with a so-called "end-effector" 515 typically at the first end portion 513; according to the embodiment example (typical and advantageous) of FIG. 3, the "end-effector" 515 may consist of a "two-tipped fork".

Figure 4A:
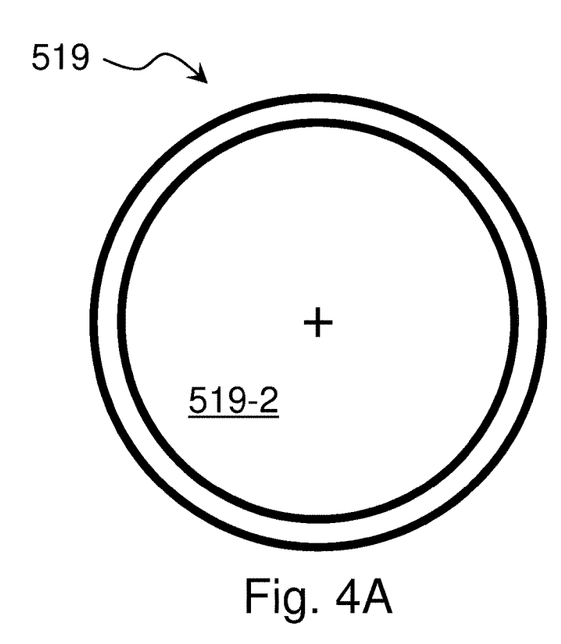
FIG. 4A shows a top view of a tool that can be used in combination with the robot of FIG. 3.
Figure 4B:
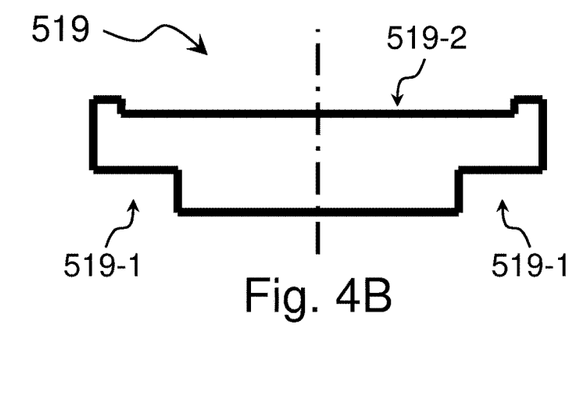
FIG. 4B shows a sectional view of a tool that can be used in combination with the robot of FIG. 3

The first end portion 513 (in particular the "end-effector" 515) can be arranged to couple with a tool 519 (see FIG. 4) arranged to grasp substrates support devices; said grasping is typically direct and can take place by friction and possibly suction.

The first end portion 513 (in particular the "end-effector" 515) can be arranged to grasp substrates; said grasping is typically direct and can take place by friction and suction. Alternatively, the first end portion 513 (in particular the "end-effector" 515) can be arranged to couple with another tool (not shown in the figures) arranged to grasp substrates; said grasping is typically direct and can take place by friction and possibly suction.

Thanks to the tool(s), the back of the substrates cannot be soiled by particles and/or substances present on the back of the support devices.

In FIG. 4, an embodiment example of a tool indicated as a whole with the reference numeral 519 is shown. It is essentially a disc: the upper face is arranged to come into contact with substrates support devices, and the lower face is arranged to come into contact with an "end-effector" (see in particular FIG. 3). On the lower face, there is preferably a shoulder 519-1 in which the "end-effector" can be inserted, in particular two of the "tips" thereof on opposite sides with respect to the axis of the tool. On the upper face, there is preferably a thin recess 519-2 arranged to compensate for any non-perfect planarity of the substrates support devices. To allow a stable and precise positioning of the tool 519, a typically axial hole, for example cylindrical or conical and for example through or blind hole, can be provided for.

For handling purposes, in particular for grasping, the articulated arm 510 can comprise a suction duct. In FIG. 3, the suction duct 518 is shown internal to the first arm member 512 only; alternatively, it could also be internal to the second arm member 516 and/or to the third arm member 517. The suction duct must be fluidically coupled to a suction generator (not shown in the figures) for example by means of a flexible tube. The suction duct 518 opens onto a surface of the "end-effector" 515 in such a way as to suck up an object in contact with the "end-effector"; it can be a suction localized in a point or, preferably, distributed over a certain area (for example a strip extending into a "U" shape in a similar way to the "end-effector" 515).

The storage chamber 400 may have a resting position 450 for the tool 519. In this case, the external robot 500 can be arranged to take/bring the tool 519 from/to the resting position 450; in particular, when the robot has to handle a support device, the "end-effector" 515 approaches the resting position 450, couples with the tool 519, moves away from the resting position 450, handles a support device, approaches the resting position 450, uncouples from the tool 519, moves away from the resting position 450.

Innovations regarding the loading/unloading group will be described below (for example the one indicated with 300 in FIG. 1) with non-limiting reference to the attached figures; this is why the technical characteristics of the embodiment examples shown in the figures are referred to only as "possible".

Figure 5:
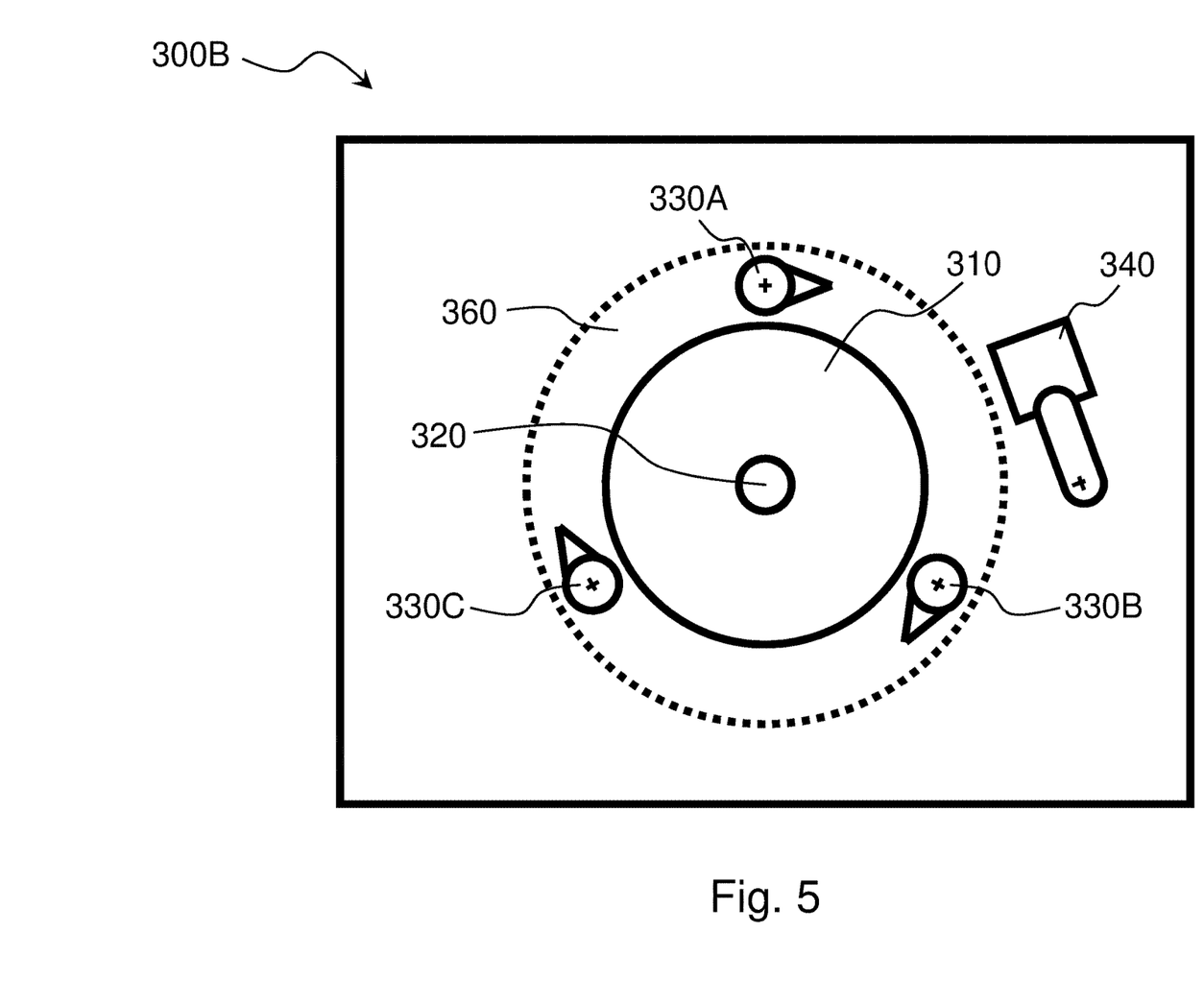
FIG. 5 shows a top (schematic) view of a station for preparing a loading/unloading group of an embodiment example of an epitaxial reactor according to the present invention.

The loading/unloading group 300, in particular the preparation station 300B (as shown in FIG. 5), may comprise a base 310 for supporting a substrates support device.

The loading/unloading group 300, in particular the preparation station 300B (as shown in FIG. 5), may comprise vertical moving means 320 for raising/lowering one or more substrates placed over a substrates support device which is supported by the base 310.

The vertical moving means 320 can comprise a movable rod arranged to raise/lower a central part of the substrates support device and a substrate rested thereon (consider for example the movable central portion or part 2540 of the device 2000 in FIG. 2B). In this case, typically, a substrate diameter is greater than a diameter of the central part.

The base 310 can be arranged to rotate a substrates support device (rested on the base) by a (variable) angle, in particular by a (variable) angle in the range from −360° (or more) to 360° (or more).

The loading/unloading group 300, in particular the preparation station 300B (as shown in FIG. 5), may comprise horizontal moving means 330 for adjusting a horizontal position of a substrates support device supported by the base 310.

The horizontal moving means 330 can comprise at least one rotatable cam (in the embodiment example of FIG. 5, three cams 330A, 330B, 330C are advantageously provided for) arranged to cause a displacement of the substrates support device.

The loading/unloading group 300, in particular the preparation station 300B (as shown in FIG. 5), may comprise cleaning means 340 for a substrates support device supported by the base 310.

The cleaning means 340 may comprise at least one suction device arranged to cause suction for example from the top and/or from the side at a circumferential edge region of the substrates support device; in the embodiment example of FIG. 5, the suction region is small (for example a few millimetres), but alternatively it could be large (for example, a few centimetres) or very large, at most it could be extended over the entire circumference; in the embodiment example of FIG. 5, the suction device is rotatable: a first angular position is used to suck from the edge and a second angular position (shown in FIG. 5) is for rest.

The treating arrangement 900 can comprise a camera 350 (it can be called "monitoring camera") directed toward an area of interest 360 of the loading/unloading group 300, in particular of the preparation station 300B (as shown in FIG. 5); in particular, the camera 350 frames at least the support base 310 and therefore any substrates support devices rested on the base 310.

The camera can operate for example in visible light; in this case, the natural light of the environment in which the reactor is installed can be used or a lighting device can be provided for.

It may be advantageous for the camera to operate also in IR and/or UV light; in this case, corresponding lighting devices are required. Combining multiple types of light can be beneficial in reliably recognizing the outlines of various elements of an image captured by the camera.

The rotation angle of the substrates support device (rested on the base 310) can be arranged to be calculated (for example by the electronic control unit 800) starting from an image generated by the camera 350.

The displacement of the substrates support device (rested on the base 310) can be arranged to be calculated (for example by the electronic control unit 800) starting from an image generated by the camera 350.

The loading/unloading group 300, in particular the load-lock chamber 300A, can comprise a cover (not shown in the figures) arranged to open and close selectively, in particular by rotation thereof; moreover, there can be a gate valve (arranged to open and close selectively) between the transfer chamber 200 and the load-lock chamber 300A. In particular, when the cover is open the load-lock chamber 300A is in communication with the storage chamber 400, and when the cover 370 is closed the load-lock chamber 300A is not in communication with the storage chamber 400.

Innovations regarding the transfer chamber will be described below (for example the one indicated with 200 in FIG. 1) with non-limiting reference to the attached figures; this is why the technical characteristics of the embodiment examples shown in the figures are referred to only as "possible".

The treating arrangement 900 may comprise a cooling station 210 adjacent to the transfer chamber 200; the cooling station 210 is arranged to contain a substrates support device with one or more substrates after a treating process.

The internal robot 600 can be arranged:
a) to transfer a substrates support device with one or more substrates from the reaction chamber 100 to the cooling station 210 typically when the support device and the substrates are still very hot,
and then
b) to transfer a substrates support device with one or more substrates from the cooling station 210 to the loading/unloading group 300, in particular to the load-lock chamber 300A thereof, typically after the support device and the substrates have sufficiently cooled down;
moreover, the internal robot 600 can be arranged:
c) to transfer a substrates support device with one or more substrates from the loading/unloading group 300, in particular from the load-lock chamber 300A thereof, to the reaction chamber 100 typically while a support device with one or more substrates is being cooled down in the cooling station 210.

A possible sequence of operations could be, for example: "a", "c", "b".

The treating arrangement 900 may also comprise a heating station 220 adjacent to the transfer chamber 200; the heating station 220 is arranged to contain a substrates support device with one or more substrates before a treating process.

The station 220 can be used to pre-heat a substrates support device with one or more substrates, but also simply to facilitate and/or speed up the transfer operations through the transfer chamber 200.

The internal robot 600 can be arranged:
d) to transfer a substrates support device with one or more substrates from the loading/unloading group 300, in particular from the load-lock chamber 300A thereof, to the heating station 220,
and then
e) to transfer a substrates support device with one or more substrates from the heating station 220 to the reaction chamber 100.

A possible sequence of operations could be, for example: "d", "a", "e", "b".

Further possible innovations will be described below.

Advantageously, the treating arrangement can comprise a code reading and recognition system (for example bar code or QR code or alphanumeric code) for reading codes on substrates and/or on substrates support devices; this system is not shown in the figures. Such a system could find a place (at least in part) in the storage chamber (for example the one indicated with 400 in FIG. 1). In this way, for example, the reactor could keep specific track, for example of the substrates that have entered the reactor and/or the substrates located in the storage chamber and still to be treated and/or of the substrates being treated and/or of the substrates located in the storage chamber and already treated and/or of substrates that have exited from the reactor. In this way, for example, the reactor could keep specific track, for example of the supports that have entered the reactor and/or of the supports located in the storage chamber (and possibly their position) and/or of the supports located in the reaction chamber and/or of the supports that have exited from the reactor. Typically, to trace the substrates and/or supports, the reading and recognition system cooperates with an electronic control unit (for example the one indicated with 800 in FIG. 1).

Advantageously, the treating arrangement can comprise an electronic control unit (for example the one indicated with 800 in FIG. 1) arranged to store data relating to the use of (at least) one substrates support device, in particular number and/or duration and/or type/types of treating processes. In this way, for example, when the reactor detects certain conditions of use relating to a substrates support device, it can decide to avoid the further use thereof and/or signal to an operator the need for cleaning or replacing it.

Two or more of the innovations described above can be advantageously combined with each other.

Figure 6:
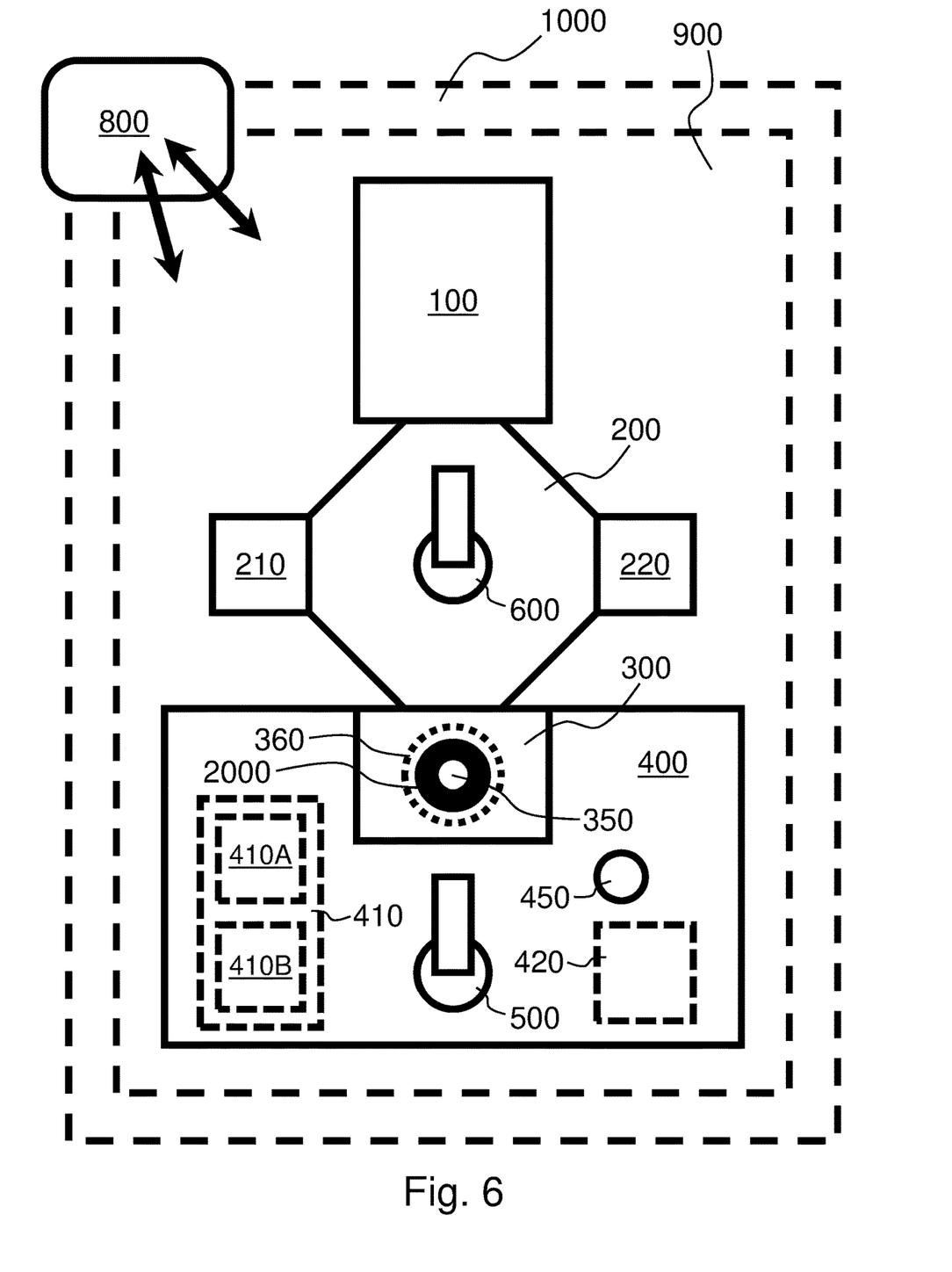
FIG. 6 shows a schematic view (which can be considered a top view) of an embodiment example of an epitaxial reactor according to the present invention that is alternative to that of FIG. 1, in which the treating arrangement is particularly detailed.

According to an embodiment shown in FIG. 6 and alternative to that of FIG. 1 (but very similar, as is evident from the similarity of these two figures), the loading/unloading group 300 consists of a load-lock chamber 300A and of a preparation station 300B associated with each other, particularly advantageously integrated with each other. According to this embodiment example, the treating arrangement can be considered to comprise a load-lock chamber with the usual two gate valves, but with additional functionalities with respect to traditional load-lock chambers.

This "integrated" solution allows avoiding some displacements of the "substrates support device" and of the substrates by the internal robot, i.e. those between the load-lock chamber and the preparation station; however, it complicates the structure of the load-lock chamber, or rather of the loading/unloading group.

In the case of the embodiment example of FIG. 6, the technical characteristics described with reference to FIG. 5 can also be referred to the preparation station 300B integrated in the loading/unloading group 300.

The invention claimed is:

1. Treating arrangement for an epitaxial reactor of the type for epitaxial deposition at high temperature of layers of semiconductor material on substrates of semiconductor material for the production of electrical components, comprising:
   a reaction chamber for treating substrates,
   a transfer chamber adjacent to the reaction chamber, for transferring substrates placed over substrates support devices,
   a loading/unloading group at least in part adjacent to the transfer chamber arranged to contain a substrates support device with one or more substrates,
   a storage chamber containing at least in part the loading/unloading group, having a first storage zone for treated and/or untreated substrates and a second storage zone for substrates support device without any substrate,
   at least one external robot for transferring treated substrates, untreated substrates and substrates support devices without any substrate between said storage chamber and said loading/unloading group,
   at least one internal robot for transferring substrates support devices with one or more substrates between said loading/unloading group and said reaction chamber via said transfer chamber;
   a control unit configured to control the at least one internal robot to interface with a tool for transferring the substrates support device from one position to another, wherein the tool includes an upper surface adapted to contact the substrates support device and a lower surface adapted to contact the at least one internal robot;
   wherein said loading/unloading group comprises a load-lock chamber and a preparation station associated with each other.

2. Treating arrangement according to claim 1, wherein said load-lock chamber and said preparation station are distinct but close to each other.

3. Treating arrangement according to claim 1, wherein said load-lock chamber and said preparation station are integrated with each other.

4. Treating arrangement according to claim 1, wherein said loading/unloading group comprises a base for supporting a substrates support device.

5. Treating arrangement according to claim 4, wherein said loading/unloading group comprises vertical moving means for raising/lowering one or more substrates placed over a substrates support device supported by said base.

6. Treating arrangement according to claim 5, wherein said vertical moving means comprise a movable rod arranged to raise/lower a central part of said substrates support device and a substrate rested thereon.

7. Treating arrangement according to claim 6, wherein a diameter of said substrate is greater than a diameter of the central part.

8. Treating arrangement according to claim 4, wherein said base is arranged to rotate a support device by an angle.

9. Treating arrangement according to claim 8, wherein said base (310) is arranged to rotate a support device by an angle in the range from 360° to +360°.

10. Treating arrangement according to claim 4, wherein said loading/unloading group comprises horizontal moving means for adjusting a horizontal position of a substrates support device supported by the base.

11. Treating arrangement according to claim 10, wherein said horizontal moving means comprise at least one rotatable cam arranged to cause a displacement of said substrates support device.

12. Treating arrangement according to claim 4, wherein said loading/unloading group comprises cleaning means for a substrates support device supported by the base.

13. Treating arrangement according to claim 12, wherein said cleaning means comprise at least one suction device arranged to cause suction at a circumferential edge region of said substrates support device.

14. Treating arrangement according to claim 8, comprising a camera directed toward an area of interest of said loading/unloading group.

15. Treating arrangement according to claim 14, wherein said angle is arranged to be calculated starting from an image generated by said camera.

16. Treating arrangement according to claim 11, wherein said displacement is arranged to be calculated starting from an image generated by a camera.

17. Epitaxial reactor of the type for epitaxial deposition at high temperature of layers of semiconductor material on substrates of semiconductor material for the production of electrical components, and comprising a treating arrangement according to claim 1.

18. Epitaxial reactor according to claim 17, of the type arranged to extract from the reaction chamber substrates at high temperature.

19. Epitaxial reactor according to claim 17, of the type arranged to introduce substrates into the reaction chamber at high temperature.

20. Epitaxial reactor according to claim 17, wherein the untreated substrates and the treated substrates are located on substrates support devices.

* * * * *